(12) United States Patent
Wang et al.

(10) Patent No.: US 11,271,012 B1
(45) Date of Patent: Mar. 8, 2022

(54) METHOD FOR IMPROVING SIZE OF CONTACT HOLES OF FDSOI DEVICE

(71) Applicant: SHANGHAI HUALI INTEGRATED CIRCUIT CORPORATION, Shanghai (CN)

(72) Inventors: Tonghui Wang, Shanghai (CN); Changfeng Wang, Shanghai (CN); Duanquan Liao, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 0 days.

(21) Appl. No.: 17/088,514

(22) Filed: Nov. 3, 2020

(30) Foreign Application Priority Data

Aug. 27, 2020 (CN) .......................... 202010877484.3

(51) Int. Cl.
| | |
|---|---|
| *H01L 27/12* | (2006.01) |
| *H01L 21/84* | (2006.01) |
| *H01L 29/78* | (2006.01) |
| *H01L 21/8238* | (2006.01) |
| *H01L 21/02* | (2006.01) |

(52) U.S. Cl.
CPC .. *H01L 27/1203* (2013.01); *H01L 21/823871* (2013.01); *H01L 21/84* (2013.01); *H01L 21/0217* (2013.01); *H01L 29/7838* (2013.01)

(58) Field of Classification Search
CPC ......... H01L 27/1203; H01L 21/823871; H01L 21/84; H01L 29/4991; H01L 29/7838; H01L 21/0217; H01L 21/0228
USPC .................. 257/347, 348; 438/149, 479, 517
See application file for complete search history.

(56) References Cited

U.S. PATENT DOCUMENTS

2008/0254617 A1* 10/2008 Adetutu et al. ... H01L 21/76877
438/643
2018/0061839 A1* 3/2018 Baars et al. .......... H01L 27/108

* cited by examiner

*Primary Examiner* — Thinh T Nguyen
(74) *Attorney, Agent, or Firm* — Alston & Bird LLP (57) ABSTRACT

The disclosure provides a FDSOI semiconductor structure and methods to fabricate it. The structure includes source and drain regions and gates respectively in an NMOS area and a PMOS area, a first oxide film layer formed on sidewalls of the source and drain contact holes, a metal layer deposited to fill the source and drain contact holes, a second oxide film layer formed on sidewalls of the gate contact holes, a metal layer deposited to fill the gate contact holes. Further the method includes growing an oxide film layer on the sidewalls of the contact holes between completing the contact etching process and filling the contact holes with the metal layer, followed by removing with etching the oxide film layer from the gates. Sizes of contact holes can be adjusted thereby.

17 Claims, 5 Drawing Sheets

METHOD FOR IMPROVING SIZE OF CONTACT HOLES OF FDSOI DEVICE

CROSS-REFERENCES TO RELATED APPLICATIONS

This application claims priority to Chinese patent application No. CN 202010877484.3, filed on Aug. 27, 2020 at CNIPA, and entitled "METHOD FOR IMPROVING SIZE OF CONTACT HOLES OF FDSOI DEVICE", the disclosure of which is incorporated herein by reference in entirety.

TECHNICAL FIELD

The disclosure relates to the technical field of semiconductor devices, and in particular to a method for improving the size of contact holes of an FDSOI device.

BACKGROUND

With continuous development of integrated circuit (IC) manufacturing technology, critical dimensions of IC devices are continuously reduced, improving integration level, working speed and the power consumption of IC devices. Among the critical dimensions, contact/vias sizes on IC devices have become ever smaller. Smaller contact dimensions require advanced photolithography machines. The traditional contact holes of devices are usually obtained through exposure, development and etching, and the dimensions of the contact holes are directly defined by patterning. Therefore, it is necessary for a photolithography machine to have advanced functions to meet the requirements of smaller contact holes. As a result, the traditional photolithography machines have process retractions when contact holes are formed at technical nodes of 22 nm and less; and advanced photolithography machines are getting ever more expensive, which has become a bottleneck of process development. This is more severely challenging in the technology of fully depleted Silicon on Insulator, or FDSOI, a planar process technology that delivers the benefits of reduced silicon geometries while simplifying the manufacturing process.

Therefore, a reliable contact patterning method is needed to solve the above problems.

BRIEF SUMMARY

Embodiments of the disclosure provide methods for forming contact holes of a FDSOI device. The methods comprises the following steps:

Step 1: providing a semiconductor structure comprising an NMOS area and a PMOS area, wherein the NMOS area comprises a first gate, a first source region and a first drain region, and wherein the PMOS area comprises a second gate, a second source region and a second drain region; wherein the semiconductor structure further comprises a silicon oxide layer disposed on the first and second gates, and the first and second source regions and the first and second drain regions;

Step 2: patterning a first source contact hole in the first source region and a first drain contact hole in the first drain region; patterning a second source contact hole in the second source region and a second drain contact hole in the second drain region;

Step 3: removing byproducts produced in the patterning of step 2;

Step 4: forming a first oxide film layer on the semiconductor structure, bottom surfaces and sidewalls of the first source contact hole, the second source contact hole, the first drain contact hole and the second drain contact hole;

Step 5: removing, by etching, the first oxide film layer from top surfaces of the semiconductor structure and from bottom surfaces of the first and second source contact holes and the first and second drain contact holes, while protecting the first oxide film layer from being removed from sidewalls of the first and second source contact holes and from the first and second drain contact holes;

Step 6: removing byproducts produced during etching the first oxide film layer in step 5;

Step 7: depositing a metal layer to fill the first and second source contact holes and the first and second drain contact holes, followed by planarization on the top surfaces of the semiconductor structure to adjust depths of the first and second source contact holes and the first and second drain contact holes;

Step 8: patterning a first gate contact hole in the first gate of the NMOS area and a second gate contact hole in the second gate of the PMOS area;

Step 9: removing byproducts produced during said gate contact holes in step 8 patterning;

Step 10: forming a second oxide film layer on the top surfaces of the semiconductor structure, bottom surfaces and sidewalls of the first and second gate contact holes;

Step 11: removing, by etching, the second oxide film layer from the top surfaces of the semiconductor structure and the bottom surfaces of the first gate contact hole and the second gate contact hole, while protecting the first oxide film layer from being removed from sidewalls of the first and second gate contact holes;

Step 12: removing byproducts produced in said etching the second oxide film layer in step 11; and Step 13: depositing a metal layer to fill the first gate contact hole and the second gate contact hole, followed by planarization on the top surfaces of the semiconductor structure to adjust depths of the first and second gate contact holes.

In some examples, the NMOS area is fabricated in a first silicon layer which is located on a first oxide layer on a P-type silicon substrate, wherein the first gate of the NMOS area is located on the first silicon layer, and wherein the first source and the first drain regions of the NMOS area are respectively located on two sides of the first gate of the NMOS area; wherein the PMOS area is fabricated in a first silicon layer, which is disposed on an oxide layer on an N-type silicon substrate, wherein the second gate of the PMOS area is located on the first silicon layer, and the second source and second drain regions of the PMOS area are respectively located on two sides of the gate of the PMOS area.

In some examples, in step 1, boron ions are implanted into the P-type silicon substrate of the NMOS area; and wherein P ions are implanted into the N-type silicon substrate of the PMOS area.

In some examples, in step 1, the NMOS area comprises a second silicon layer and a metal silicide on the second silicon layer in the first source and first drain regions; and wherein the PMOS area comprises an SiGe layer and a metal silicide layer on the SiGe layer in the second source and second drain regions.

In some examples, in step 2, the silicon oxide layer on the first source and first drain regions of the NMOS area and second source and second drain regions of the PMOS area is etched until the metal silicide layer is exposed, so as to form the first and second source contact holes and the first and second drain contact holes.

In some examples, in step 3, the byproducts removed comprise organic matters and micro particles.

In some examples, in step 4, forming a first oxide film layer comprises applying atomic layer deposition to grow and form the first oxide film layer on the semiconductor structure.

In some examples, in step 4, a thickness of the formed first oxide film layer ranges from 25 Å to 50 Å.

In some examples, in step 5, removing the first oxide film layer comprises apply the technique of dry etching.

In some examples, in step 6, removing the byproducts in step 5 comprises a technique of wet cleaning, wherein the said byproducts comprise organic matters and micro particles.

In some examples, in step 7, the metal layer deposited on the semiconductor structure is tungsten.

In some examples, in step 9, removing the byproducts produced in step 8 comprises a technique of wet cleaning, wherein said byproducts in step 8 comprise organic matters and micro particles.

In some examples, in step 10, depositing the second oxide film layer comprises applying atomic layer deposition.

In some examples, in step 10, a thickness of second oxide film layer ranges from 25 Å to 50 Å.

In some examples, in step 11, said removing the second oxide film layer comprises applying a technique of dry etching.

In some examples, in step 12, removing the byproducts in step 11 comprises applying a technique of wet cleaning, wherein the byproducts comprise organic matters and micro particles.

In some examples, in step 13, the metal layer deposited comprises tungsten.

As described above, the method for forming contact holes of the FDSOI device provided by the disclosure has the following beneficial effects: the disclosure is applied to advanced processes of FDSOI CMOS semiconductor device of 22 nm or below note. Compared with the traditional FDSOI process, an oxide film layer is grown on the sidewalls of the contact holes after the contact etching process is completed and before the metal layer is filled into the contacts followed by removing the oxide film layer from the upper surface of the gates, and adjusting the sizes of contacts thereby.

DETAILED DESCRIPTION OF THE DISCLOSURE

The embodiments of the disclosure will be described below through specific examples, and those skilled in the art can easily understand other advantages and effects of the disclosure from the content disclosed in the description. The disclosure may also be implemented or applied through other different specific embodiments, and various details in the description may also be modified or changed based on different viewpoints and applications without departing from the spirit of the disclosure.

It should be noted that the drawings provided in the embodiments are only used for schematically describing the basic concept of the disclosure, thus only illustrate components related to the disclosure, and are not drawn according to the number, shape and size of the components in the actual implementation. The form, number and scale of the components may be freely changed and the layout of the components may be more complex.

The disclosure provides a method for improving the size of contact holes of an FDSOI device. The method at least includes the following steps:

A FDSOI device includes a semiconductor structure. The following description provides the steps for forming the structure. In step 1, the semiconductor structure at least includes source and drain regions and a gate in an NMOS area, and source and drain regions and a gate in a PMOS area. The source and drain regions and the gates of PMOS and NMOS each includes a silicon oxide layer.

Figure 1:
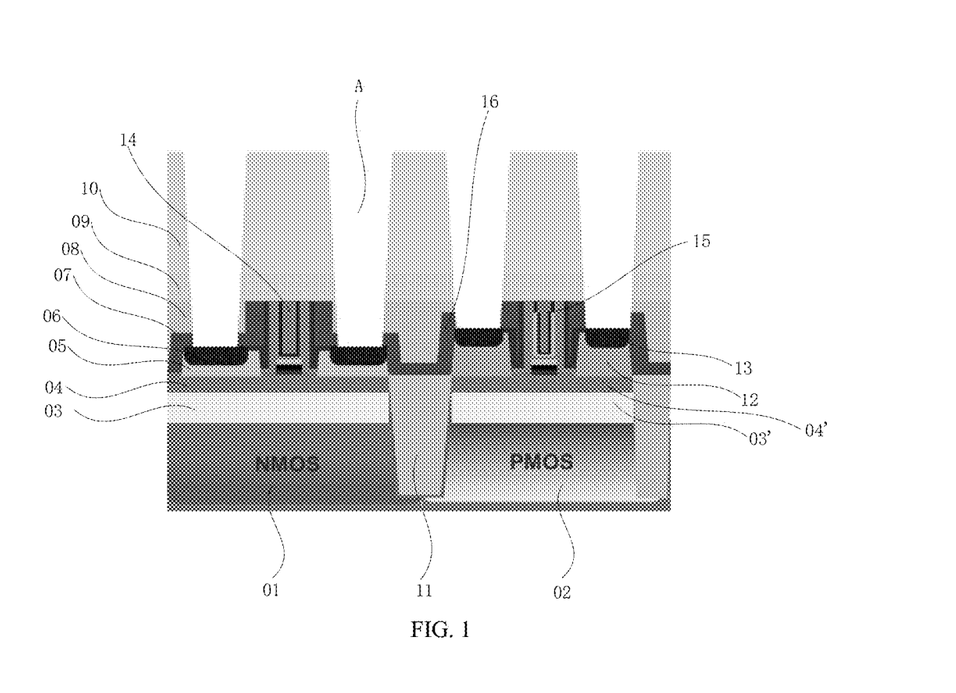
FIG. 1 illustrates a schematic view of the source and drain contact hole structure after etching is performed according to the current disclosure.

According to the current disclosure, referring to FIG. 1, in step 1, the NMOS area includes a P-type silicon substrate 01, an oxide layer 03 on the P-type silicon substrate 01 and a first silicon layer 04 on the oxide layer 03, a gate 14 of the NMOS is located on the first silicon layer 04, and the source and drain regions of the NMOS area are located at the two sides of the NMOS gate 14 respectively. The PMOS area includes an N-type silicon substrate 02, an oxide layer 03' on the N-type silicon substrate 02 and a first silicon layer 04' on the oxide layer 03', a gate 15 of the PMOS device is located on the first silicon layer 04', and the source and drain regions of the PMOS device are located at the two sides of the PMOS gate 15 respectively. Other layers in FIG. 1 will be further explained in the following paragraphs.

Figure 2:
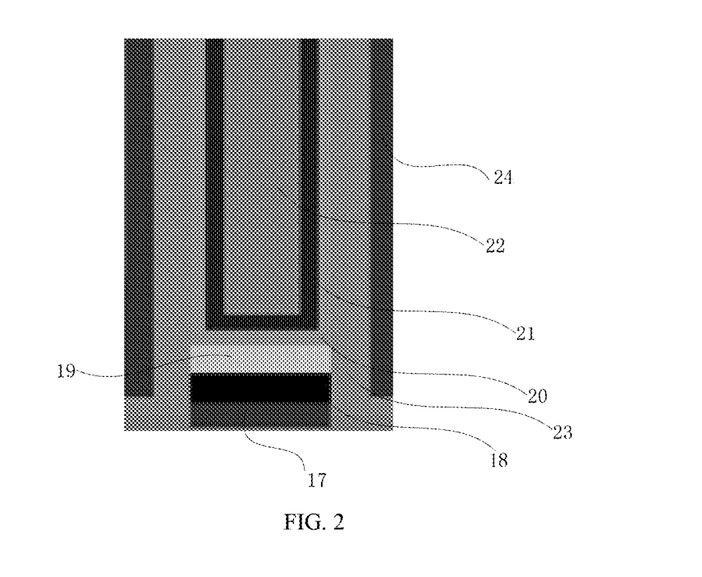
FIG. 2 illustrates an enlarged schematic view of the gate structure in an NMOS area according to the current disclosure.

FIG. 2 illustrates an enlarged schematic view of the gate 14 structure in an NMOS area in FIG. 1, according to the current disclosure. The gate 14 includes a first silicon oxide layer 17, an Hydrofluoroolefins (HFO) layer 18 disposed on the first silicon oxide layer 17, a titanium nitride (TiN) layer 19 disposed on the HFO layer 18, a tantalum nitride (TaN) groove 20 formed on the TiN layer 19, an aluminum titanium (TiAl) groove 21 formed in the TaN groove 20, an aluminum metal layer 22 filled into the TiAl groove 21, a silicon carbide nitride (SiCN) layer 23 disposed on the side surfaces of the first silicon oxide layer 17, the HFO layer 18, the TiN layer 19 and the TaN groove 20. In addition, a second silicon oxide layer 24 is disposed on the outer surfaces of the SiCN layer 23.

Figure 3:
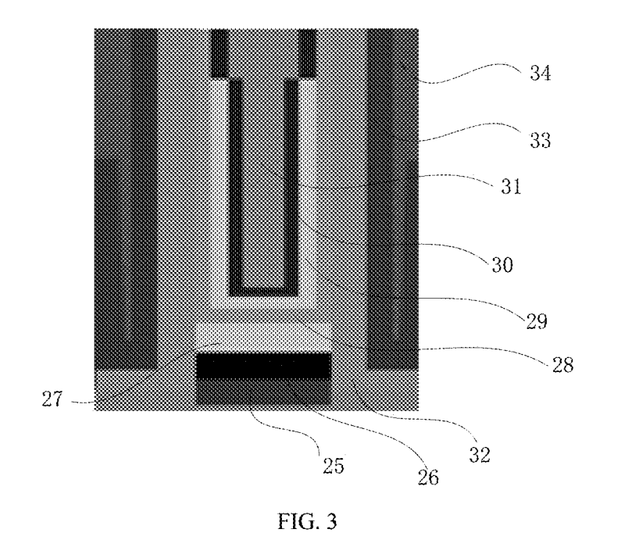
FIG. 3 illustrates an enlarged schematic view of the gate structure in a PMOS area according to the current disclosure.

FIG. 3 illustrates an enlarged schematic view of the gate structure 15 of the PMOS area in FIG. 1.

The gate 15 includes a third silicon oxide layer 25, an HFO layer 26 disposed on the third silicon oxide structure 25, a TiN layer 27 disposed on the HFO layer 26, a TaN groove 28 formed on the TiN layer 27, a TiN groove 29 formed in the TaN groove 28, a TiAl groove 30 formed in the TiN groove 29, an aluminum 31 metal layer filled into the TiAl groove 30, an SiCN layer 32 disposed on the outer side of the third silicon oxide structure 25, the HFO layer 26, the TiN layer 27 and the TaN groove 28, a fourth silicon oxide layer 33 disposed on the outer side surfaces of the SiCN layer 32, and an silicon nitride (SiN) layer 34 disposed on the fourth silicon oxide layer 33. The SiN layer 34 and the SiN layer 07 in FIG. 1 outside of the source and drain regions are formed in the same deposition step of the process.

FIG. 1 shows that the NMOS area and the PMOS area are isolated by a shallow trench isolation (STI) region 11, an SiN layer 16 is provided on top of the STI region 11. The SiN layer 16, the SiN layer 34 and the SiN layer 07 are formed in the same deposition step of the process.

According to the disclosure, the following fabrication steps are performed. In step 1, boron (B) ions are doped into the P-type silicon substrate 01 of the NMOS area by an ion implantation step; phosphorus (P) ions are doped into the N-type silicon substrate 02 of the PMOS area by another ion implantation step.

Further in the present embodiment described in FIG. 1, in step 1, the source and drain regions of the NMOS area include a second silicon layer 05 and a metal silicide layer 06 on the second silicon layer 05. In the present embodiment, the metal silicide layer 06 includes material nickel silicide (NiSi). The source and drain regions of the PMOS area include a silicon geranium (SiGe) layer 12 and a metal silicide layer 13 on the SiGe layer 12.

In step 2, the silicon oxide layer in the source and drain regions of the NMOS area and the PMOS area is patterned to form source and drain contact holes. In step 2, the silicon oxide layer on the source and drain regions of the NMOS area and the PMOS area is etched until the metal silicide layers 06 and 13 are exposed, so as to form the source and drain contact holes. Referring to FIG. 1, the silicon oxide layers in the NMOS area and the PMOS area include silicon oxide layers 08, 09 and 10, and the silicon oxide layers 08, 09 and 10 are formed on the NMOS area and the PMOS area in three separate steps. Further, in step 2, the silicon oxide layers 08, 09 and 10 on the source and drain regions of the NMOS area and the PMOS area are etched until the metal silicide layers 06 on the NMOS area and the metal silicide layers 13 on the source and drain regions of the PMOS area are exposed, so as to form the source and drain contact holes A of NMOS and A' of PMOS.

In step 3, byproducts such as organic matters and micro particles produced in the process of etching to form the source and drain contact holes in the semiconductor structure are removed. Wet cleaning following etching removes the byproducts produced in the process of etching to form the source and drain contact holes on the semiconductor structure.

Figure 4:
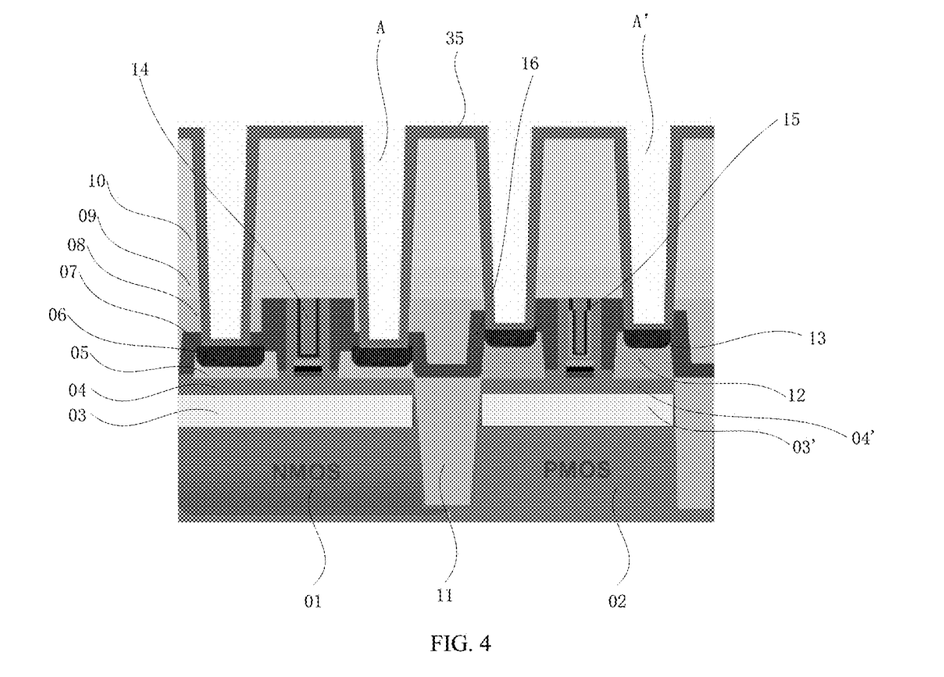
FIG. 4 illustrates a schematic view of the device structure after the first oxide film layer is formed on the semiconductor structure according to the current disclosure.

In step 4, a first oxide film layer is formed on the semiconductor structure. The bottom and sidewall of the source and drain contact holes are coated with the first oxide film layer. Referring to FIG. 4, the first oxide film layer 35 is deposited on the sidewalls of both source and drain contact holes A of NMOS and A' of PMOS (i.e., the sidewalls of the silicon oxide layers 08, 09 and 10) and coated the upper surfaces of the remaining silicon oxide layers 08, 09 and 10 with the same deposition step.

Further, in step 4, Atomic Layer Deposition (ALD) technique is adopted to grow and form the first oxide film layer 35 on the semiconductor structure. In step 4, the thickness of the grown and formed first oxide film layer 35 is in the range of 25 Å-50 Å. By growing the first oxide film layer 35 on the sidewalls of the source and drain contact holes A of NMOS and A' of PMOS and optimizing their thickness, the required sizes of the source and drain contact holes A of NMOS and A' of PMOS can be obtained.

Figure 5:
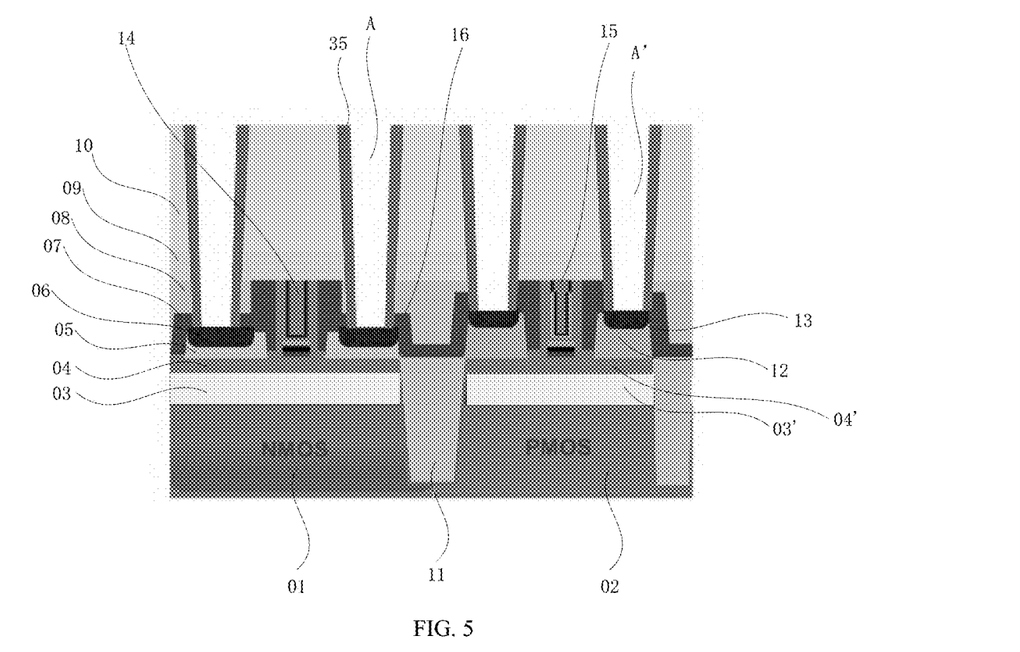
FIG. 5 illustrates a schematic view of the device structure after a first oxide film layer is formed on the sidewalls of the source and drain contact holes according to the current disclosure.

In step 5, etching is performed to remove the first oxide film layer from the upper surfaces of the semiconductor structures and the bottom surfaces of the source and drain contact holes, meanwhile to preserve the first oxide film layer on the sidewalls of the source and drain contact holes at the same time. Referring to FIG. 5, in step 5, the first oxide film layer 35 on the upper surfaces of the semiconductor structures (i.e., the first oxide film layer 35 on the upper surfaces of the silicon oxide layer 10) and the bottom surfaces of the source and drain contact holes A of NMOS and A' of PMOS is etched to expose the metal silicide layers 06 and the metal silicide layers 13 on the source and drain regions respectively of the NMOS area and the PMOS area, and to preserve the first oxide film layer 35 on the sidewalls of the source and drain contact holes A of NMOS and A' of PMOS at the same time.

Further, in step 5, dry etching is adopted to remove the first oxide film layer on the upper surfaces of the semiconductor structures and the bottom surfaces of the source and drain contact holes.

In step 6, the semiconductor structures are cleaned to remove the byproducts produced in the process of etching the first oxide film layer. These byproducts include organic matters and micro particles. Further, in step 6, wet cleaning is adopted to remove the byproducts produced in the process of etching the first oxide film layer.

In step 7, a metal layer is deposited on the semiconductor structures to fill the source and drain contact holes in both PMOS and NMOS areas, followed by surface planarization to the semiconductor structure to adjust the depths of the source and drain contact holes. The metal layer deposited on the semiconductor structures includes tungsten.

Figure 6:
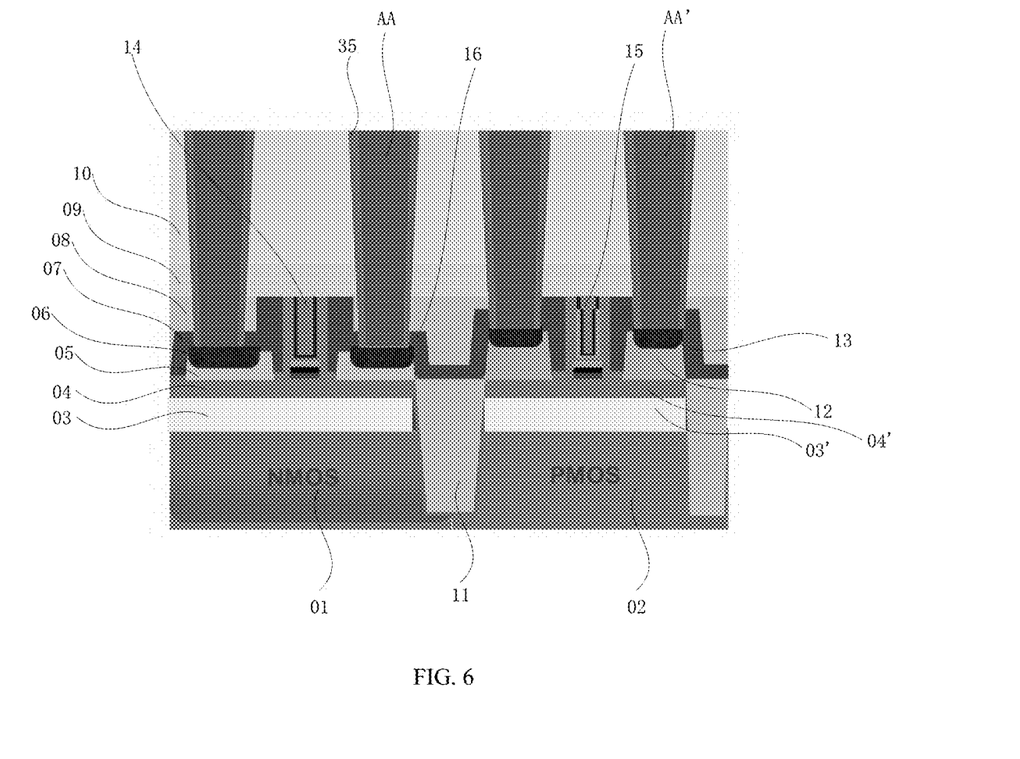
FIG. 6 illustrates a schematic view of the device structure after metal filling into the source and drain contact holes according to the current disclosure.

FIG. 6 illustrates a schematic view of a semiconductor structure after the metal tungsten is filled into the source and drain contact holes AA in NMOS and AA' in PMOS according to the disclosure. The source and drain contact holes AA of NMOS and AA' of PMOS filled with the metal tungsten and the metal silicide form contacts.

Figure 7:
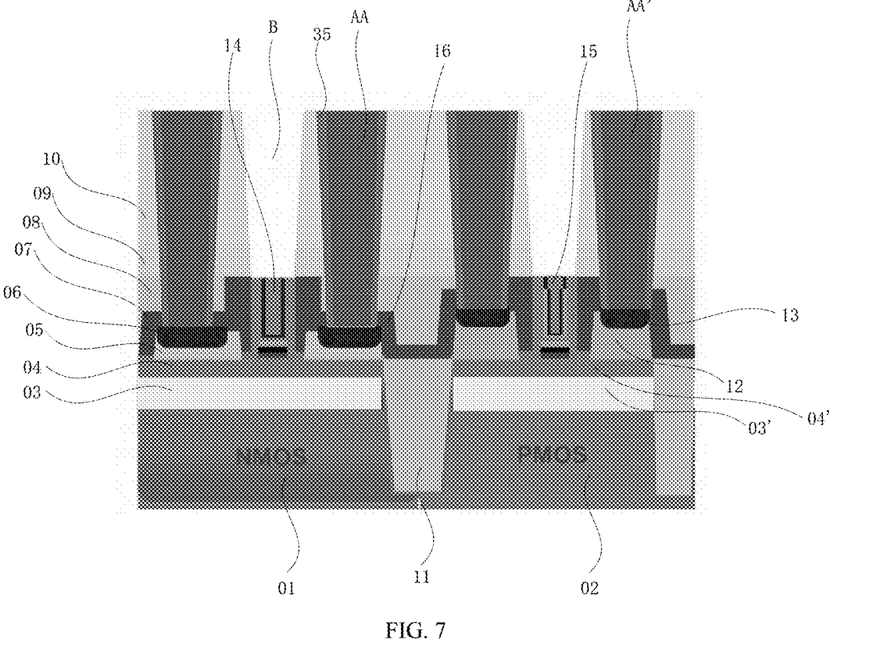
FIG. 7 illustrates a schematic view of the device structure after etching is performed to form gate contact holes according to the current disclosure.

In step 8, the silicon oxide layers on the gate 14 of the NMOS area and gate 15 of the PMOS area are etched respectively to form gate contact holes. Referring to FIG. 7, the silicon oxide layers 08, 09 and 10 on the gate 14 of the NMOS area and the gate 15 of the PMOS area are etched to form gate contact holes B in NMOS and B' in PMOS exposing the top surfaces of the gates 14 and 15.

In step 9, byproducts produced in the process of etching to form the gate contact holes on the semiconductor structures are removed. The byproducts include organic matters and micro particles. Further, in step 9, wet cleaning is adopted to remove the byproducts produced in the process of etching to form the gate.

Figure 8:
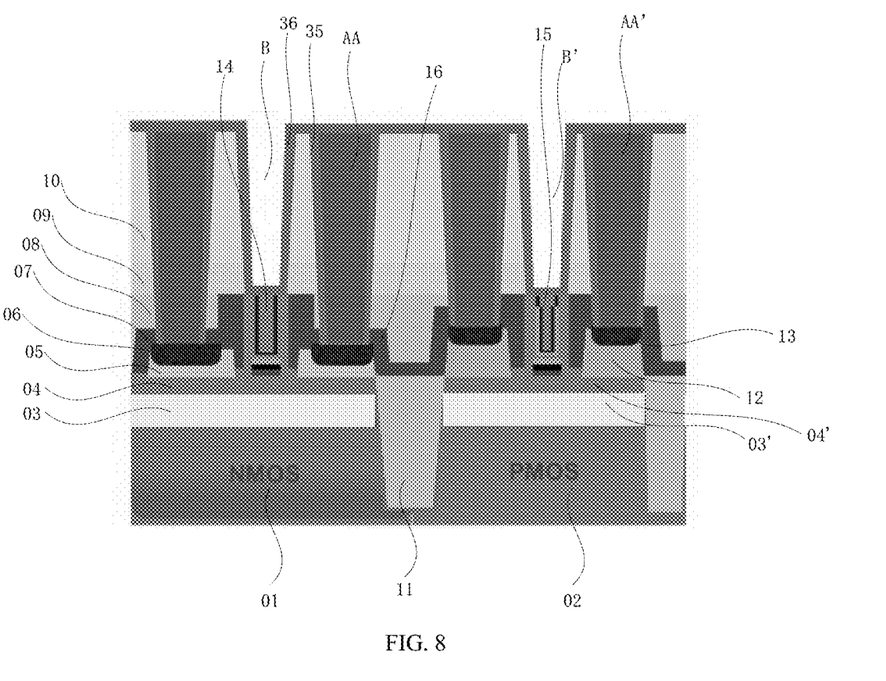
FIG. 8 illustrates a schematic view of the device structure after forming the second oxide film layer according to the current disclosure.

In step 10, a second oxide film layer is formed on the semiconductor structures. The bottom surfaces and sidewall surfaces of the gate contact holes are disposed with the second oxide film layer. In step 10, atomic layer deposition technique is applied to grow and form the second oxide film layer on the semiconductor structures. In step 10, the thickness of the grown and formed second oxide film layer is in the range of 25 Å-50 Å. Referring to FIG. 8, in the present embodiment, in step 10, the second oxide film layer 36 grown on the semiconductor structures is disposed on the sidewalls of the gate contact holes B of NMOS and B' of PMOS, and the upper surfaces of the semiconductor structures.

Figure 9:
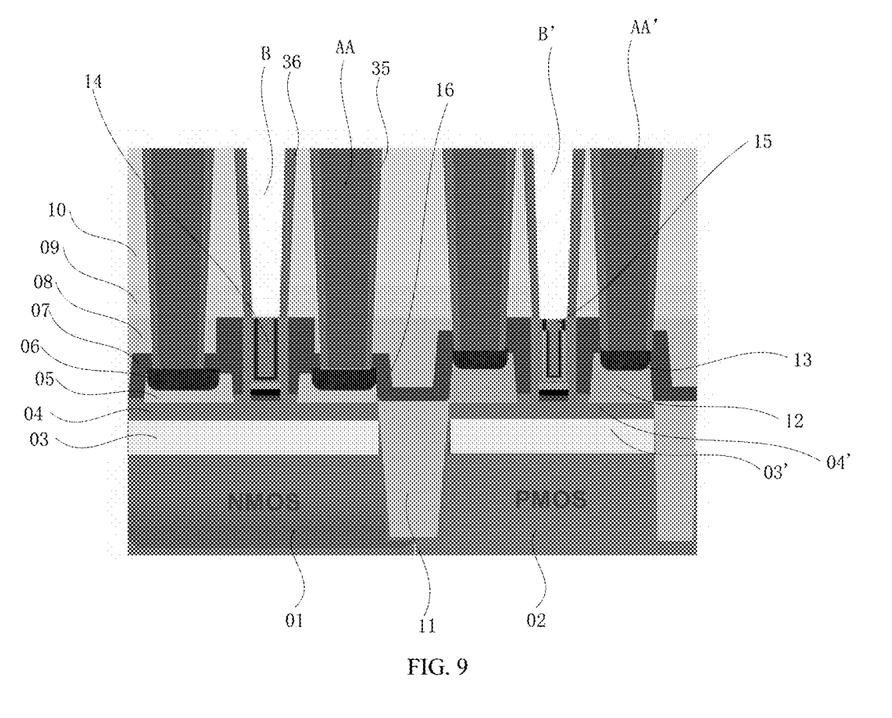
FIG. 9 illustrates a schematic view of the device structure after the second oxide film layer is formed on the sidewalls of the gate contact holes according to the current disclosure.

In step 11, etching is performed to remove the second oxide film layer on the semiconductor structures and the bottom surfaces of the gate contact holes, at the same time preserve the second oxide film layer on the sidewalls of the gate contact holes. In step 11, dry etching is applied to remove the second oxide film layer 36 from the semiconductor structures and the bottom surface of the gate contact holes. In step 11 of FIG. 9, dry etching is applied to remove the second oxide film layer 36 from the bottom surfaces of the contact holes B of NMOS and B' of PMOS of the gates 14 and 15, as well as from the upper surfaces of the semiconductor structures, meanwhile keeping the second oxide film layer 36 on the sidewalls and bottom surfaces of the gates' contact holes B of NMOS and B' of PMOS. As a result, the gate 14 of the NMOS area and the gate 15 of the PMOS area are exposed.

In step 12, the semiconductor structures are cleaned to remove byproducts produced in the process of etching the second oxide film layer. The byproducts include organic matters and micro particles. Wet cleaning is applied to remove the byproducts produced in the process of etching the second oxide film layer.

In step 13, a metal layer is deposited on the semiconductor structures to fill the gates' contact holes, followed by performing surface planarization to adjust the depths of the gates' contact holes. Further, in step 13, the metal layer deposited on the semiconductor structures includes tungsten.

To sum up, the disclosure is applied to integrated fabrication process of FDSOI CMOS semiconductor devices in advanced notes such as the 22 nm and below. Compared with the traditional FDSOI process, in the disclosure, an oxide film layer is grown on the sidewalls of the contact holes between the contact hole patterning process and the metal contact hole filling step. After the oxide film growth, an etching is performed to remove the oxide film layer on the upper surfaces of the gates, and the size of the contact holes is adjusted as well. Therefore, the disclosed technique effectively overcomes various disadvantages in the prior arts, offering a great utilization value in the industry.

The above embodiments are used for describing the principle and effect of the disclosure only, instead of limiting the disclosure. Those skilled in the art may modify or change the above embodiments without going beyond the spirit and scope of the disclosure. Therefore, all equivalent modifications or changes made by those skilled in the art without departing from the spirit and technical concept disclosed in the disclosure shall still be covered by the claims of the disclosure.

What is claimed is:

1. A method for forming contact holes of an FDSOI device, comprising the following steps:
step 1: providing a semiconductor structure comprising an NMOS area and a PMOS area, wherein the NMOS area comprises a first gate, a first source region and a first drain region, and wherein the PMOS area comprises a second gate, a second source region and a second drain region;
wherein the semiconductor structure further comprises a silicon oxide layer disposed on the first and second gates, and the first and second source regions and the first and second drain regions; step 2: patterning a first source contact hole in the first source region and a first drain contact hole in the first drain region;
patterning a second source contact hole in the second source region and a second drain contact hole in the second drain region;
step 3: removing byproducts produced in the patterning of step 2;
step 4: forming a first oxide film layer on the semiconductor structure, bottom surfaces and sidewalls of the first source contact hole, the second source contact hole, the first drain contact hole and the second drain contact hole;
step 5: removing, by etching, the first oxide film layer from top surfaces of the semiconductor structure and from bottom surfaces of the first and second source contact holes and the first and second drain contact holes, while protecting the first oxide film layer from being removed from sidewalls of the first and second source contact holes and from the first and second drain contact holes;
step 6: removing byproducts produced during etching the first oxide film layer in step 5;
step 7: depositing a metal layer to fill the first and second source contact holes and the first and second drain contact holes, followed by planarization on the top surfaces of the semiconductor structure to adjust depths of the first and second source contact holes and the first and second drain contact holes;
step 8: patterning a first gate contact hole in the first gate of the NMOS area and a second gate contact hole in the second gate of the PMOS area;
step 9: removing byproducts produced during said gate contact holes in step 8 patterning;
step 10: forming a second oxide film layer on the top surfaces of the semiconductor structure, bottom surfaces and sidewalls of the first and second gate contact holes;
step 11: removing, by etching, the second oxide film layer from the top surfaces of the semiconductor structure and the bottom surfaces of the first gate contact hole and the second gate contact hole, while protecting the first oxide film layer from being removed from sidewalls of the first and second gate contact holes;
step 12: removing byproducts produced in said etching the second oxide film layer in step 11; and
step 13: depositing a metal layer to fill the first gate contact hole and the second gate contact hole, followed by planarization on the top surfaces of the semiconductor structure to adjust depths of the first and second gate contact holes.

2. The method for forming contact holes of the FDSOI device according to claim 1, wherein the NMOS area is fabricated in a first silicon layer which is located on a first oxide layer on a P-type silicon substrate, wherein the first gate of the NMOS area is located on the first silicon layer, and wherein the first source and the first drain regions of the NMOS area are respectively located on two sides of the first gate of the NMOS area;
wherein the PMOS area is fabricated in a first silicon layer, which is disposed on an oxide layer on an N-type silicon substrate, wherein the second gate of the PMOS area is located on the first silicon layer, and the second source and second drain regions of the PMOS area are respectively located on two sides of the gate of the PMOS area.

3. The method for forming contact holes of the FDSOI device according to claim 2, wherein in step 1, B ions are implanted into the P-type silicon substrate of the NMOS area; and wherein P ions are implanted into the N-type silicon substrate of the PMOS area.

4. The method for forming the contact holes of the FDSOI device according to claim 3, wherein in step 1, the NMOS area comprises a second silicon layer and a metal silicide on the second silicon layer in the first source and first drain regions; and wherein the PMOS area comprises an SiGe layer and a metal silicide layer on the SiGe layer in the second source and second drain regions.

5. The method for forming contact holes of the FDSOI device according to claim 1, wherein in step 2, the silicon oxide layer on the first source and first drain regions of the NMOS area and second source and second drain regions of the PMOS area is etched until the metal silicide layer is exposed, so as to form the first and second source contact holes and the first and second drain contact holes.

6. The method for forming contact holes of the FDSOI device according to claim 1, wherein in step 3, the byproducts removed comprise organic matters and micro particles.

7. The method for forming contact holes of the FDSOI device according to claim 1, wherein in step 4, forming a first oxide film layer comprises applying atomic layer deposition to grow and form the first oxide film layer on the semiconductor structure.

8. The method for forming contact holes of the FDSOI device according to claim 7, wherein in step 4, a thickness of the formed first oxide film layer ranges from 25 Å to 50 Å.

9. The method for forming contact holes of the FDSOI device according to claim 1, wherein in step 5, removing the first oxide film layer comprises apply the technique of dry etching.

10. The method for forming contact holes of the FDSOI device according to claim 1, wherein in step 6, removing the byproducts in step 5 comprises a technique of wet cleaning, wherein the said byproducts comprise organic matters and micro particles.

11. The method for forming contact holes of the FDSOI device according to claim 1, wherein in step 7, the metal layer deposited on the semiconductor structure is tungsten.

12. The method for forming contact holes of the FDSOI device according to claim 1, wherein in step 9, removing the byproducts produced in step 8 comprises a technique of wet cleaning, wherein said byproducts in step 8 comprise organic matters and micro particles.

13. The method for forming contact holes of the FDSOI device according to claim 1, wherein in step 10, depositing the second oxide film layer comprises applying atomic layer deposition.

14. The method for forming contact holes of the FDSOI device according to claim 13, wherein in step 10, a thickness of second oxide film layer ranges from 25 Å to 50 Å.

15. The method for forming contact holes of the FDSOI device according to claim 1, wherein in step 11, said removing the second oxide film layer comprises applying a technique of dry etching.

16. The method for forming contact holes of the FDSOI device according to claim 1, wherein in step 12, removing the byproducts in step 11 comprises applying a technique of wet cleaning, wherein the byproducts comprise organic matters and micro particles.

17. The method for forming contact holes of the FDSOI device according to claim 1, wherein in step 13, the metal layer deposited comprises tungsten.

* * * * *